United States Patent
Nakamura

(10) Patent No.: US 9,640,420 B2
(45) Date of Patent: *May 2, 2017

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/179,063

(22) Filed: Jun. 10, 2016

(65) Prior Publication Data

US 2016/0365270 A1 Dec. 15, 2016

(30) Foreign Application Priority Data

Jun. 12, 2015 (JP) .................. 2015-118922

(51) Int. Cl.
H01L 21/00 (2006.01)
H01L 21/683 (2006.01)
H01L 21/78 (2006.01)
H01L 23/544 (2006.01)

(52) U.S. Cl.
CPC .......... *H01L 21/6836* (2013.01); *H01L 21/78* (2013.01); *H01L 23/544* (2013.01); *H01L 2221/68327* (2013.01); *H01L 2223/5446* (2013.01)

(58) Field of Classification Search
CPC ..... H01L 21/78; H01L 21/304; H01L 21/268; H01L 21/67132; H01L 21/67092; H01L 21/6836; H01L 21/02076
USPC .................. 438/33, 113, 114, 462
See application file for complete search history.

(56) References Cited

U.S. PATENT DOCUMENTS

| 9,269,624 B2 | 2/2016 | Nakamura et al. |
| 2005/0106782 A1* | 5/2005 | Genda .......... B23K 26/18 438/118 |
| 2005/0272223 A1 | 12/2005 | Fujii et al. |
| 2006/0216911 A1 | 9/2006 | Yoshikawa et al. |
| 2009/0042488 A1 | 2/2009 | Sekiya et al. |
| 2009/0091044 A1 | 4/2009 | Seo et al. |
| 2010/0129546 A1 | 5/2010 | Kitahara et al. |

(Continued)

FOREIGN PATENT DOCUMENTS

| JP | 10-050642 | 2/1998 |
| JP | 2002-192370 | 7/2002 |

(Continued)

OTHER PUBLICATIONS

U.S. Appl. No. 14/958,268, filed Dec. 3, 2015.

*Primary Examiner* — Brook Kebede

(74) *Attorney, Agent, or Firm* — Greer Burns & Crain Ltd.

(57) ABSTRACT

A method of processing a wafer includes coating the front side of the wafer with a water-soluble liquid resin to form a thin film; fixing the wafer to a protective plate for protecting the front side of the wafer, with a bond material interposed between the protective plate and the thin film; holding by a chuck table the protective plate with the wafer fixed thereto and grinding the back side of the wafer to make the wafer have a predetermined thickness; releasing step of releasing the bond material together with the protective plate to which the wafer has been fixed; and supplying water to the bond material remaining on the front side of the wafer to remove the thin film together with the bond material.

3 Claims, 12 Drawing Sheets

(56) References Cited

U.S. PATENT DOCUMENTS

| | | |
|---|---|---|
| 2011/0059620 A1 | 3/2011 | Kitahara |
| 2012/0003816 A1 | 1/2012 | Shimotani et al. |
| 2013/0087947 A1 | 4/2013 | Kitahara et al. |
| 2013/0330857 A1* | 12/2013 | Sekiya .................... H01L 33/58 438/27 |
| 2015/0104930 A1 | 4/2015 | Aikawa et al. |

FOREIGN PATENT DOCUMENTS

| | | |
|---|---|---|
| JP | 2003-007648 | 1/2003 |
| JP | 2004-160493 | 6/2004 |
| JP | 2005-223282 | 8/2005 |
| JP | 2008-235650 | 10/2008 |
| JP | 2010-219461 | 9/2010 |
| JP | 2012-160515 | 8/2012 |
| JP | 2013-165229 | 8/2013 |

* cited by examiner

WAFER PROCESSING METHOD

BACKGROUND OF THE INVENTION

Field of the Invention

The present invention relates to a method of processing a wafer which is formed on a front side thereof with a plurality of division lines in a crossing pattern and in which a plurality of devices are formed in a plurality of regions partitioned by the division lines.

Description of the Related Art

In the semiconductor device manufacturing process, for example, devices such as integrated circuits (ICs) and large-scale integrations (LSIs) are formed in a plurality of regions partitioned by division lines formed in a crossing pattern on a front side of a substantially disk-shaped wafer, and the regions formed with the devices are divided along the division lines, to produce individual device chips. Meanwhile, the wafer is generally subjected to grinding of the back side by a grinding apparatus to have a predetermined thickness before the division into the individual device chips.

The grinding apparatus includes grinding means and grinding feeding means. The grinding means includes a chuck table having a holding surface for holding the wafer thereon, and a grinding wheel for grinding an upper side of the wafer held on the chuck table. The grinding feeding means moves the grinding means in a direction perpendicular to the holding surface of the workpiece holding means. A protective member is adhered to the front side of the wafer by a bond material such as a wax in order to protect the devices, the protective member together with the wafer fixed thereon is placed on the holding surface of the chuck table, and the back side of the wafer is ground by the grinding means to make the wafer have a predetermined thickness (see, for example, Japanese Patent Laid-Open Nos. 1998-50642, 2010-219461, and 2012-160515).

SUMMARY OF THE INVENTION

When a protective plate is adhered to the front side of the wafer by a bond material such as a wax, however, there is a problem that part of the bond material is slightly left on the front side of the wafer upon removal of the bond material together with the protective plate from the front side of the wafer after grinding of the back side of the wafer, resulting in a lowering of device quality. The phenomenon in which the bond material is left on the front side of the wafer is frequently generated in the case where electrodes provided for the devices are formed as bumps projecting by 50 to 200 µm.

Accordingly, it is an object of the present invention to provide a wafer processing method by which a bond material for mounting a protective plate to the front side of a wafer in order to protect devices at the time of grinding the back side of the wafer can be reliably removed from the front side of the wafer after the grinding.

In accordance with an aspect of the present invention, there is provided a method of processing a wafer which is formed on a front side thereof with a plurality of division lines in a crossing pattern and in which a plurality of devices are formed in a plurality of regions partitioned by the division lines, the method including: a water-soluble resin coating step of coating the front side of the wafer with a water-soluble liquid resin to form a thin film; a protective plate fixing step of fixing the wafer to a protective plate for protecting the front side of the wafer, with a bond material interposed between the protective plate and the thin film; a back side grinding step of holding by a chuck table the protective plate with the wafer fixed thereto and grinding a back side of the wafer to make the wafer have a predetermined thickness; a protective plate releasing step of releasing the bond material together with the protective plate to which the wafer has been fixed, after the back side grinding step is conducted; and a bond material removing step of supplying water to the bond material remaining on the face side of the wafer having been subjected to the protective plate releasing step, to remove the thin film together with the bond material.

Preferably, the wafer processing method further includes a cut groove forming step of forming cut grooves corresponding to a finished thickness of the devices along the division lines from the side of the face side of the wafer before the water-soluble resin coating step is conducted, and, in the back side grinding step, the cut grooves are exposed to the back side of the wafer to thereby divide the wafer into the individual devices.

Preferably, the wafer processing method further includes a modified layer forming step of applying a laser beam having such a wavelength as to be transmitted through the wafer along the division lines, with a focal point of the laser beam being positioned inside the wafer, to form a modified layer serving as a division start point along each of the division lines inside the wafer, and, in the back side grinding step, the wafer is divided along the division lines along which the modified layers serving as the division start points have been formed, into the individual devices.

According to the present invention, the wafer processing method includes the bond material removing step of supplying water to the bond material remaining on the front side of the wafer having been subjected to the protective plate releasing step, to thereby remove the thin film together with the bond material. Therefore, even if the bond material is left on the front side of the wafer upon the protective plate releasing step, the removal of the thin film formed of a water-soluble resin and coating the front side of the wafer by water in the bond material removing step causes the bond material to be also removed, so that the quality of the device chips is prevented from being lowered due to such bond material.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
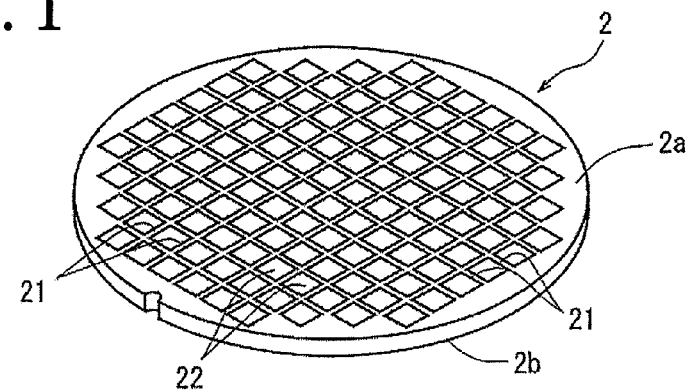
FIG. 1 is a perspective view of a semiconductor wafer.

Some preferred embodiments of the wafer processing method according to the present invention will be described in detail below, referring to the attached drawings. FIG. 1 depicts a perspective view of a semiconductor wafer to be processed according to the present invention. The semiconductor wafer 2 depicted in FIG. 1 is a silicon wafer having a thickness of, for example, 600 μm, and is formed on its front side 2a with a plurality of division lines 21 in a crossing pattern, and devices 22 such as ICs and LSIs are formed in a plurality of regions partitioned by the division lines 21. In the following, a wafer processing method in which the back side 2b of the semiconductor wafer 2 is ground to make the semiconductor wafer 2 have a predetermined thickness will be described. The workpiece to be processed is not limited to the semiconductor wafer but includes other wafers such as an optical device wafer.

Figures 2A, 2B:
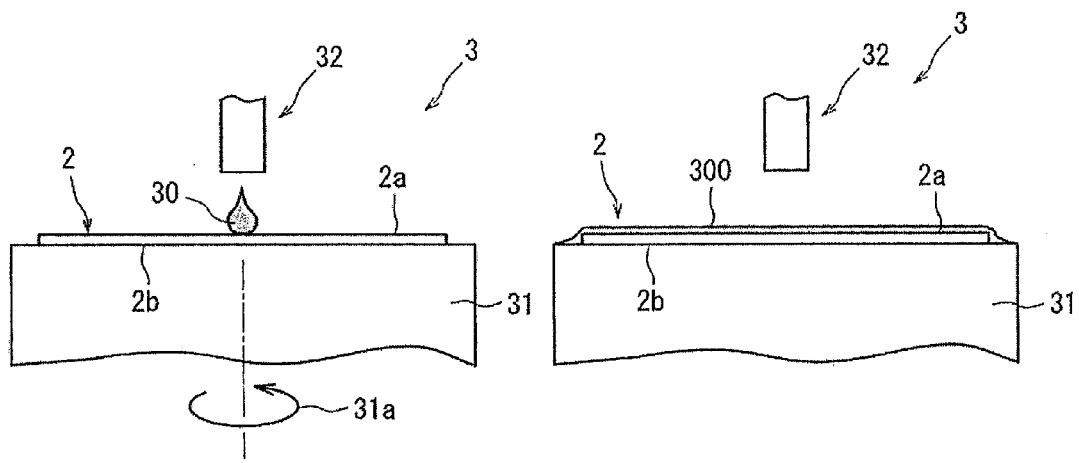
FIGS. 2A to 2C illustrate a water-soluble resin coating step.
Figure 2C:
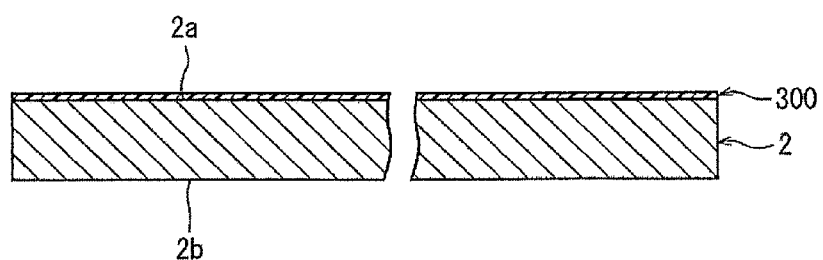

First, a water-soluble resin coating step of coating the front side 2a of the above-mentioned semiconductor wafer 2 with a water-soluble liquid resin to form a thin film is conducted. The water-soluble resin coating step is carried out by use of a resin film forming apparatus 3 depicted in FIGS. 2A and 2B. The resin film forming apparatus 3 depicted in FIGS. 2A and 2B includes a spinner table 31 for holding the workpiece, and a liquid resin supply nozzle 32 disposed on the upper side of a center of rotation of the spinner table 31. On the spinner table 31 of the resin film forming apparatus 3 configured in this way, the semiconductor wafer 2 is placed with its back side 2b on the lower side. Then, suction means (not depicted) is operated to suction hold the semiconductor wafer 2 on the spinner table 31. Therefore, the semiconductor wafer 2 held on the spinner table 31 has its front side 2a on the upper side. After the semiconductor wafer 2 is held on the spinner table 31 in this manner, the spinner table 31 is rotated at a predetermined rotational speed (for example, 500 to 3,000 rpm) in the direction indicated by arrow 31a as depicted in FIG. 2A, and, while continuing the rotation, a predetermined amount of a liquid resin 30 is dropped to a central region of the front side 2a of the semiconductor wafer 2 from the liquid resin supply nozzle 32 disposed on the upper side of the spinner table 31. Then, with the spinner table 31 rotated for approximately 60 seconds, a thin film 300 is formed on the front side 2a of the semiconductor wafer 2 as depicted in FIGS. 2B and 2C. The thickness of the thin film 300 formed on the front side 2a of the semiconductor wafer 2 by the coating is determined by the amount of the liquid resin 30 dropped, and may be approximately 1 to 3 μm. Note that the water-soluble liquid resin is desirably a liquid resin that is cured when irradiated with ultraviolet (UV) rays. Examples of resins usable as the liquid resin that is cured by irradiation with UV rays include polyvinyl alcohol (PVA), polyethylene glycol (PEPG) and polyethylene oxide (PEO).

Figure 3:
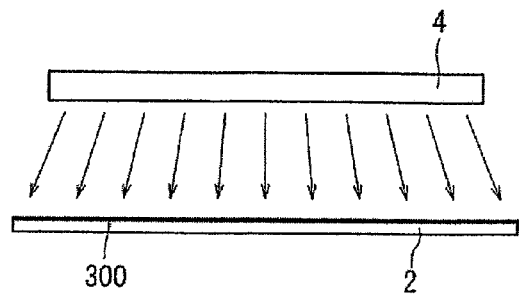
FIG. 3 illustrates a thin film curing step.

After the aforementioned water-soluble resin coating step is performed, a thin film curing step is carried out in which the thin film 300 formed on the front side 2a of the semiconductor wafer 2 is cured by irradiation with UV rays. Specifically, as depicted in FIG. 3, the thin film 300 formed on the front side 2a of the semiconductor wafer 2 is irradiated with UV rays by a UV irradiation device 4. As a result, the thin film 300 formed of the liquid resin 30 curable by irradiation with UV rays is cured.

Figure 4A:
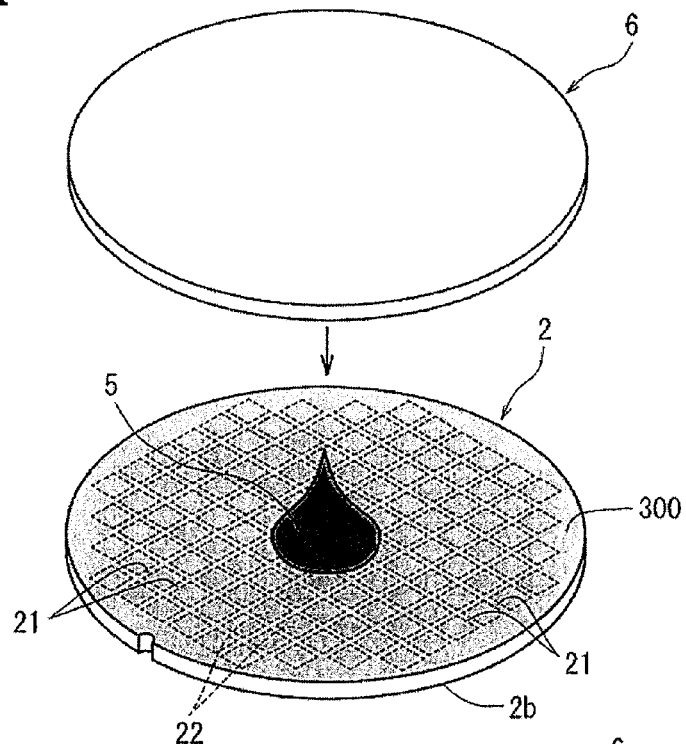
FIGS. 4A and 4B illustrate a protective plate fixing step.
Figure 4B:
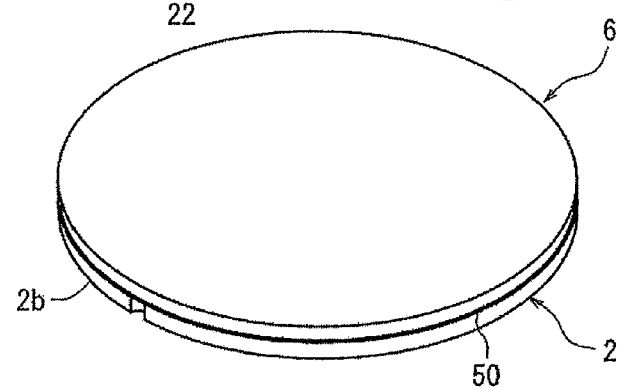

Next, a protective plate fixing step is conducted in which the semiconductor wafer 2 having been subjected to the water-soluble resin coating step is fixed to a protective plate for protecting the front side 2a of the semiconductor wafer 2, with a bond material interposed between the protective plate and the thin film 300. Specifically, as depicted in FIGS. 4A and 4B, a predetermined amount of a bond material 5 is supplied onto the thin film 300 formed on the front side 2a of the semiconductor wafer 2, and the bond material 5 is pressed by a protective plate 6 uniformly over the whole area, whereby the semiconductor wafer 2 is fixed to the protective plate 6 through a bond layer 50 having a uniform thickness, as depicted in FIG. 4B. Note that the thickness of the bond layer 50 interposedly formed between the protective plate 6 and the thin film 300 formed on the front side 2a of the semiconductor wafer 2 may be approximately 10 to 200 μm. In addition, the bond material 5 is desirably a resin that is curable by irradiation with UV rays. Examples of resins usable as the UV-curable resin include polyester (meth)acrylate, polyurethane (meth)acrylate, and epoxy (meth)acrylate. Besides, the protective plate 6 is desirably a resin sheet transparent to UV rays; for example, a polyethylene terephthalate (PET) resin sheet, polyolefin resin sheets and the like having a thickness of approximately 500 μm to 1 mm, for example, can be used.

Figure 5:
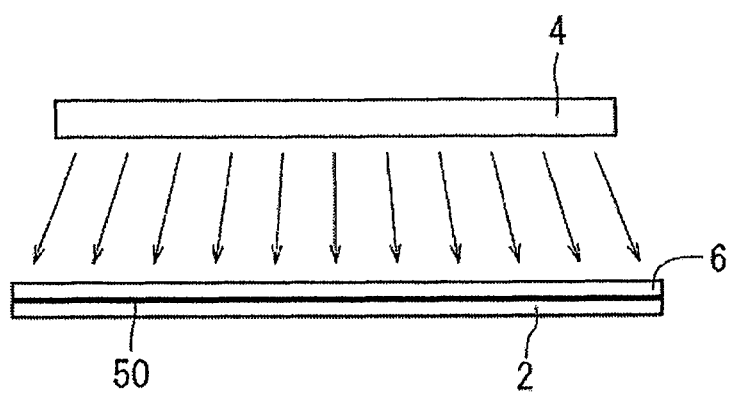
FIG. 5 illustrates a bond layer curing step.

After the aforementioned protective plate fixing step is conducted, a bond layer curing step is carried out in which the bond layer 50 is cured by irradiation with UV rays through the protective plate 6 to which the semiconductor wafer 2 is fixed. Specifically, as depicted in FIG. 5, UV rays are applied by a UV irradiation device 4 from the side of the protective plate 6 to which the semiconductor wafer 2 is fixed. In the embodiment illustrated, since the protective plate 6 includes a resin sheet transparent to UV rays, the bond layer 50 is irradiated with UV rays through the protective plate 6, whereby the bond layer 50 is cured.

Subsequently, a back side grinding step is performed in which the protective plate 6 with the semiconductor wafer 2 fixed thereto is held on a chuck table, and the back side 2b of the semiconductor wafer 2 is ground to make the semiconductor wafer 2 have a predetermined thickness. The back side grinding step is carried out using a grinding apparatus 7 depicted in FIG. 6A. The grinding apparatus 7 depicted in FIG. 6A includes a chuck table 71 as holding means for holding the workpiece thereon, and grinding means 72 for grinding the workpiece held on the chuck table 71. The chuck table 71 is configured such as to suction hold the workpiece on its upper surface, and is rotated in the direction indicated by arrow 71a in FIG. 6A by a rotational driving mechanism (not depicted). The grinding means 72 includes a spindle housing 721, a rotating spindle 722 rotatably supported on the spindle housing 721 and rotated by a rotational driving mechanism (not depicted), a mounter 723 attached to a lower end of the rotating spindle 722, and a grinding wheel 724 mounted to a lower surface of the mounter 723. The grinding wheel 724 includes a circular annular base 725, and abrasive grindstones 726 mounted to a lower surface of the base 725 in an annular pattern. The base 725 is mounted to the lower surface of the mounter 723 by fastening bolts 727.

Figure 6A:
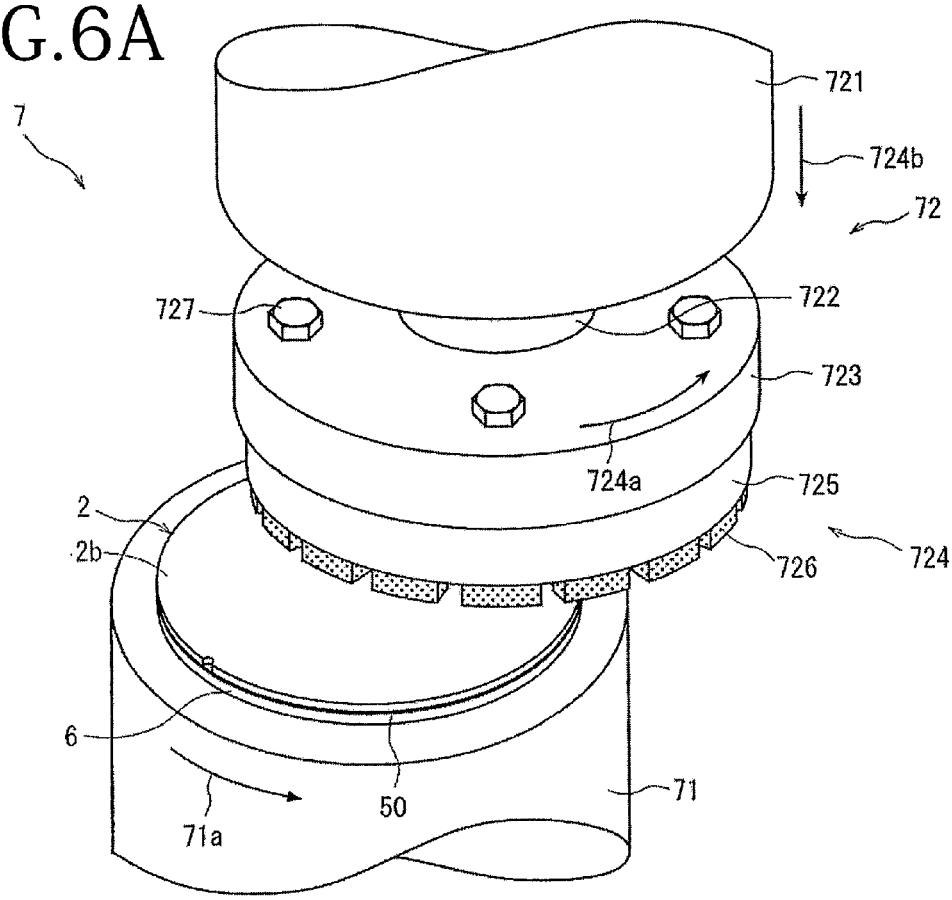
FIGS. 6A and 6B illustrate a back side grinding step.
Figure 6B:
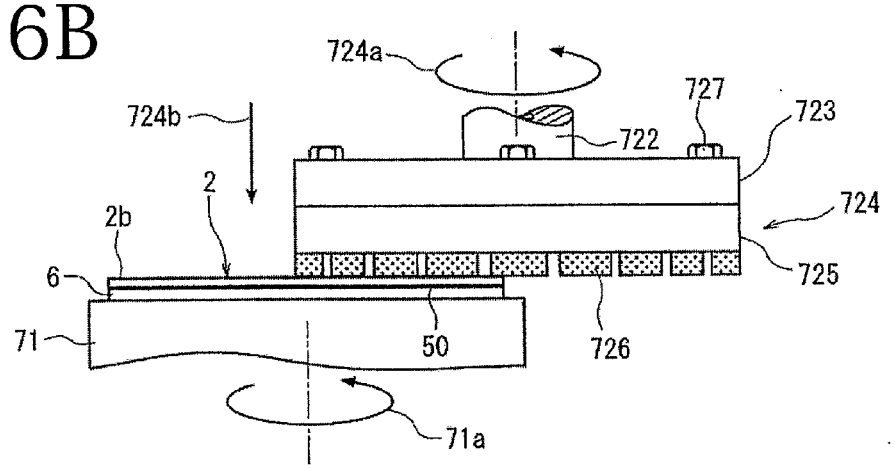

In carrying out the back side grinding step by use of the aforementioned grinding apparatus 7, the protective plate 6 with the semiconductor wafer 2 fixed thereto is placed on an upper surface (holding surface) of the chuck table 71 as depicted in FIG. 6A. Then, suction means (not depicted) is operated to suction hold the semiconductor wafer 2 on the chuck table 71 through the protective plate 6 therebetween (wafer holding step). Therefore, the semiconductor wafer 2 held on the chuck table 71 has its back side 2b on the upper side. After the semiconductor wafer 2 thus suction held on the chuck table 71 through the protective plate 6, the chuck table 71 is rotated at, for example, 300 rpm in the direction indicated by arrow 71a in FIG. 6A. While keeping the rotation, the grinding wheel 724 of the grinding means 72 is rotated at, for example, 6,000 rpm in the direction indicated by arrow 724a in FIG. 6A, the abrasive grindstones 726 are brought into contact with the back side 2b of the semiconductor wafer 2 serving as a work surface as depicted in FIG. 6B, and the grinding wheel 724 is put to grinding feed by a predetermined amount downward (in the direction perpendicular to the holding surface of the chuck table 71) at a grinding feed rate of, for example, 1 µm/second as indicated by arrow 724b. As a result, the back side 2b of the semiconductor wafer 2 is ground to make the semiconductor wafer 2 have a predetermined thickness (for example, 100 µm).

Figure 7A:
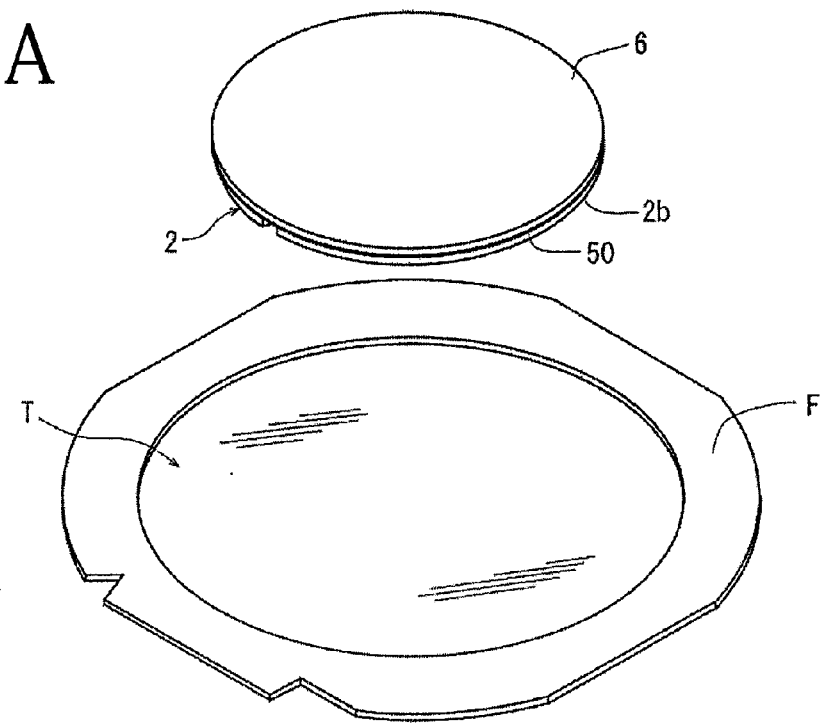
FIGS. 7A and 7B illustrate a protective plate releasing step.
Figure 7B:
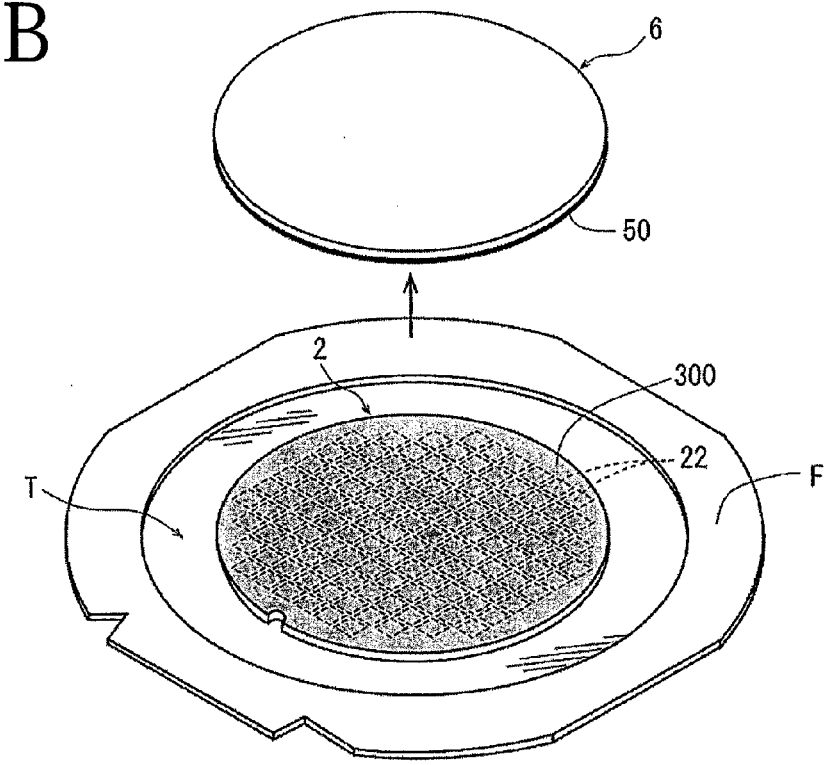

Next, a protective plate releasing step is carried out to release the bond layer 50 formed of the bond material 5 together with the protective plate 6 to which the semiconductor wafer 2 having been subjected to the back side grinding step is fixed. Specifically, as illustrated in FIGS. 7A and 7B, the back side 2b of the semiconductor wafer 2 is adhered to a front side of a dicing tape T which includes a synthetic resin sheet of polyolefin or the like and an outer peripheral portion of which is disposed such as to cover an inside opening portion of an annular frame F, and the bond layer 50 is released from the semiconductor wafer 2 together with the protective plate 6 to which the semiconductor wafer 2 has been fixed. Note that in releasing the bond layer 50 from the semiconductor wafer 2 together with the protective plate 6, the releasing operation can be easily performed by carrying out the operation while supplying steam to the bond layer 50 interposed between the semiconductor wafer 2 and the protective plate 6. Even when the bond layer 50 is released from the semiconductor wafer 2 together with the protective plate 6 in this way, part of the bond material 5 may be left on the front side 2a of the semiconductor wafer 2.

Figure 8A:
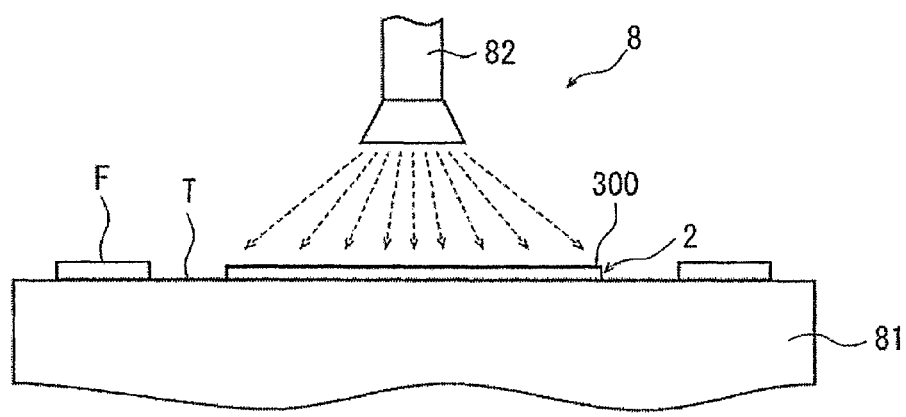
FIGS. 8A and 8B illustrate a bond material removing step.
Figure 8B:
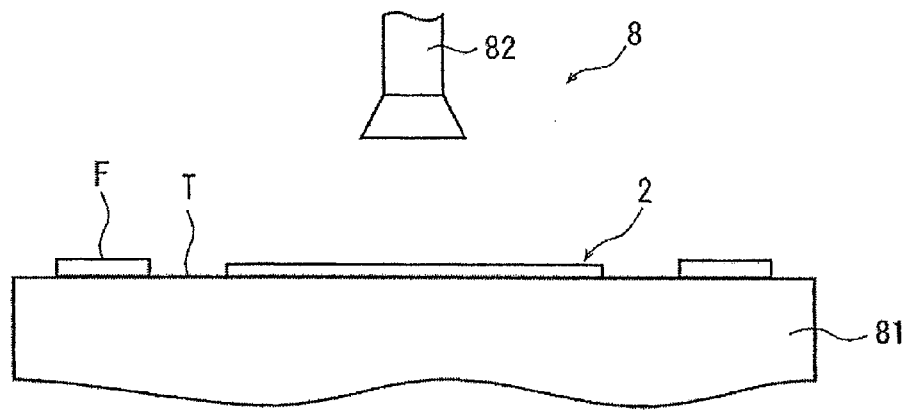

After the aforementioned protective plate releasing step is conducted, a bond material removing step is carried out in which water is supplied to the bond material 5 remaining on the front side 2a of the semiconductor wafer 2, to remove the thin film 300 together with the bond material 5. Specifically, as depicted in FIG. 8A, the semiconductor wafer 2 which has been subjected to the protective plate releasing step and which is supported on the annular frame F through the dicing tape T is placed on a holding table 81 of a cleaning device 8 through the dicing tape T, and suction means (not depicted) is operated to suction hold the semiconductor wafer 2 on the holding table 81 through the dicing tape T. Then, cleaning water is supplied to the bond material 5 remaining on the front side 2a of the semiconductor wafer 2 and the thin film 300 from a cleaning water supply nozzle 82 disposed on the upper side of the holding table 81. As a result, the thin film 300 is easily removed by the cleaning water as depicted in FIG. 8B because it is formed of the water-soluble resin, and the bond material 5 remaining on the front side 2a of the semiconductor wafer 2 is also removed. Therefore, a situation where part of the bond material 5 is left on surfaces of devices is obviated, and, accordingly, device quality can be prevented from being lowered due to such bond material 5.

The semiconductor wafer 2 thus having been subjected to the bond material removing step is carried to the subsequent step, namely, a wafer dividing step in the state of being supported on the annular frame F through the dicing tape T, and is divided along division lines 21 into individual devices 22.

Now, a second embodiment of the wafer processing method of the present invention will be described below. In the second embodiment, before the aforementioned water-soluble resin coating step is conducted, a cut groove forming step of forming cut grooves corresponding to a finished thickness of the devices 22 along the division lines 21 from the side of the front side 2a of the semiconductor wafer 2 is carried out, and, in the back side grinding step, the cut grooves are exposed to the back side 2b of the semiconductor wafer 2 to thereby divide the semiconductor wafer 2 into the individual devices 22.

Here, the cut groove forming step will be described referring to FIGS. 9A and 9B.

Figure 9A:
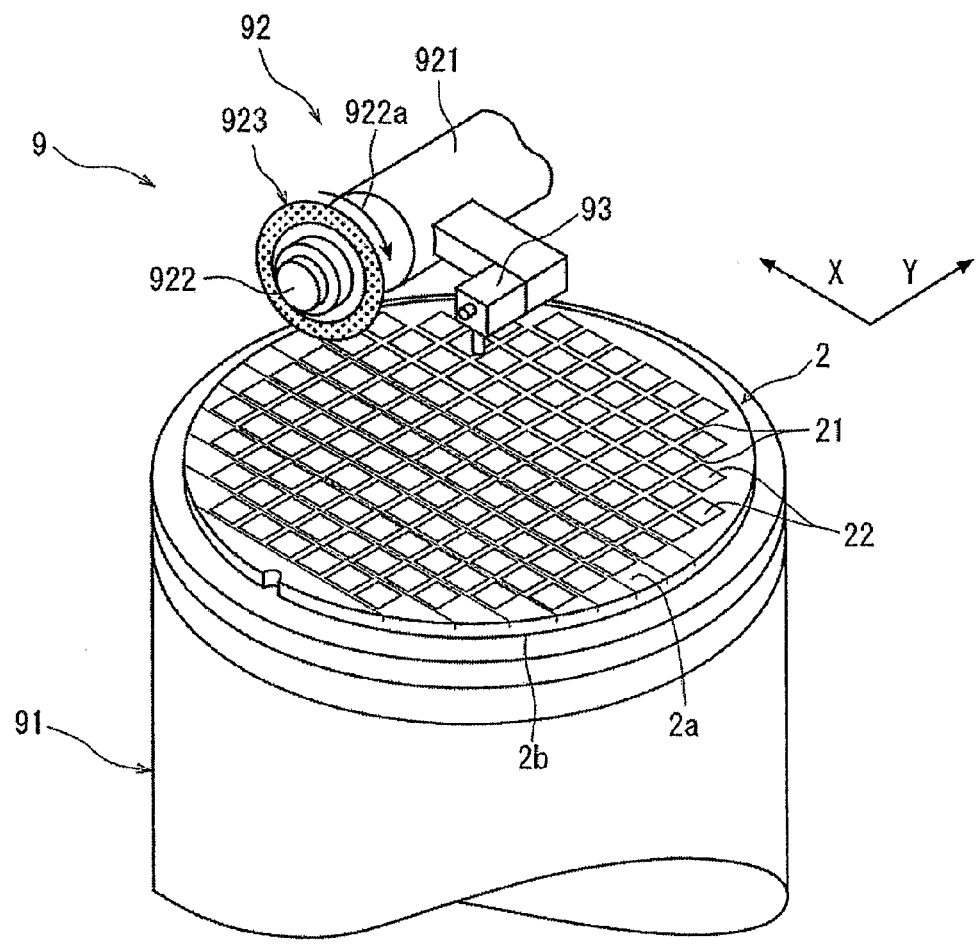
FIGS. 9A and 9B illustrate a cut groove forming step in a second embodiment.
Figure 9B:
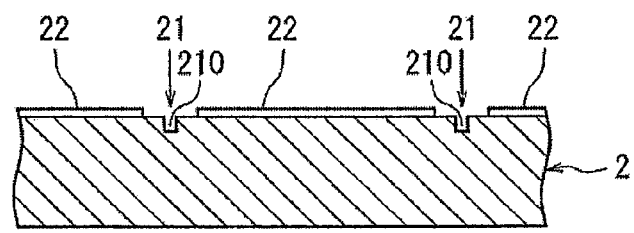

The cut groove forming step is carried out using a cutting apparatus 9 depicted in FIG. 9A. The cutting apparatus 9 depicted in FIG. 9A includes a chuck table 91 for holding a workpiece thereon, cutting means 92 for cutting the workpiece held on the chuck table 91, and imaging means 93 for imaging the workpiece held on the chuck table 91. The chuck table 91 is configured to suction hold the workpiece, is moved in a cutting feed direction indicated by arrow X in FIG. 9A by a cutting feeding mechanism (not depicted), and is moved in an indexing feed direction indicated by arrow Y by an indexing feeding mechanism (not depicted).

The cutting means 92 includes a spindle housing 921 disposed substantially horizontally, a rotating spindle 922 rotatably supported on the spindle housing 921, and a cutting blade 923 attached to a tip portion of the rotating spindle 922, and the rotating spindle 922 is rotated in the direction indicated by arrow 922a by a servo motor (not depicted) disposed inside the spindle housing 921. Note that the thickness of the cutting blade 923 is set to 30 µm in this embodiment. The imaging means 93 is mounted to a tip portion of the spindle housing 921, and includes illumination means for illuminating the workpiece, an optical system for capturing a region illuminated by the illumination means, an imaging element (charge-coupled device: CCD) for picking up an image captured by the optical system, and the like, and an image signal thus obtained is sent to control means (not depicted).

In carrying out the cut groove forming step by use of the aforementioned cutting apparatus 9, the semiconductor wafer 2 is placed on the chuck table 91 with its back side 2b on the lower side, as depicted in FIG. 9A, and suction means (not depicted) is operated to suction hold the semiconductor wafer 2 on the chuck table 91. Therefore, the semiconductor wafer 2 held on the chuck table 91 has its front side 2a on the upper side. The chuck table 91 with the semiconductor wafer 2 suction held thereon in this way is positioned directly under the imaging means 93 by a cutting feeding mechanism (not depicted).

After the chuck table 91 is positioned directly under the imaging means 93, an alignment work is carried out in which a cutting region where to form a cut groove along the division line 21 of the semiconductor wafer 2 is detected by the imaging means 93 and control means (not depicted). Specifically, the imaging means 93 and the control means (not depicted) perform image processing such as pattern matching for matching the position of the division line 21 formed in a predetermined direction of the semiconductor wafer 2 and the position of the cutting blade 923 to each other, to thereby achieve alignment of the cutting region (alignment step). In addition, alignment of the cutting region is conducted also for the division lines 21 formed on the semiconductor wafer 2 to extend in a direction orthogonal to the predetermined direction.

After the alignment for detecting the cutting region of the semiconductor wafer 2 held on the chuck table 91 is thus conducted, the chuck table 91 with the semiconductor wafer 2 held thereon is moved to a cutting start position of the cutting region. Then, the cutting blade 923 being rotated in a direction indicated by arrow 922a in FIG. 9A is moved downward to perform cutting-in feed. The cutting-in feed position is set in such a manner that an outer peripheral edge of the cutting blade 923 reaches a depth position (for example, 100 μm) corresponding to the finished thickness of the devices from the front side 2a of the semiconductor wafer 2. After the cutting-in feed of the cutting blade 923 is performed in this manner, while rotating the cutting blade 923 the chuck table 91 is subjected to cutting feed in the direction indicated by arrow X in FIG. 9A, whereby a cut groove 210 having a width of 30 μm and a depth (for example, 100 μm) corresponding to the finished thickness of the devices is formed along the division line 21 as depicted in FIG. 9B (cut groove forming step).

Figure 10A:
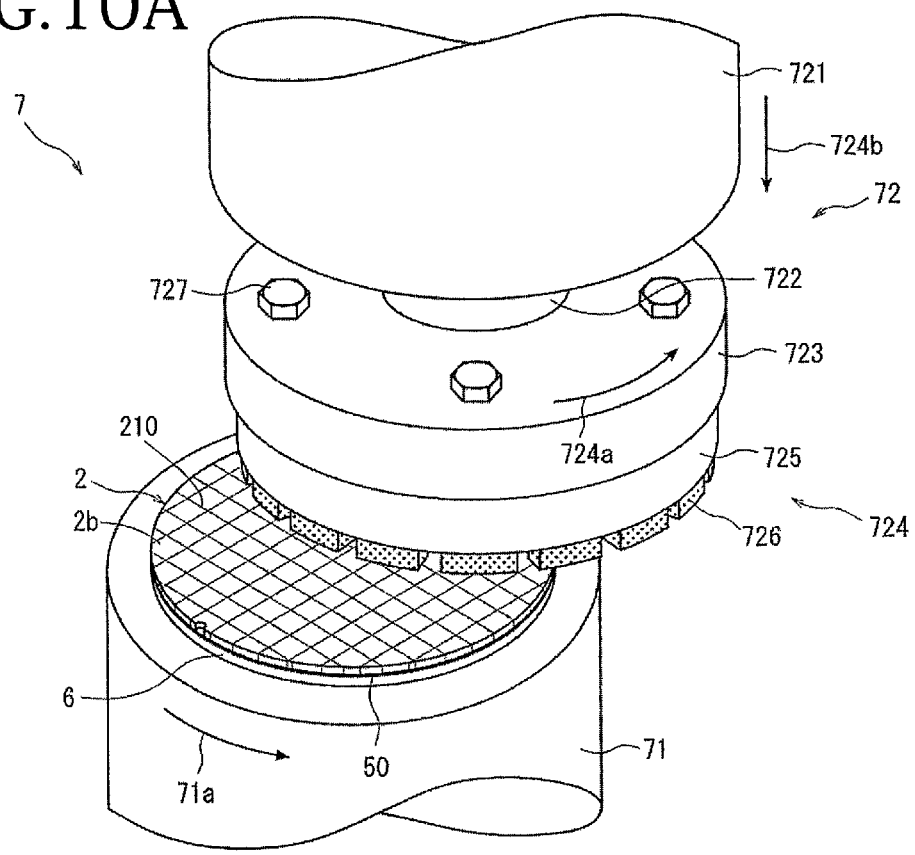
FIGS. 10A and 10B illustrate a back side grinding step in the second embodiment.
Figure 10B:
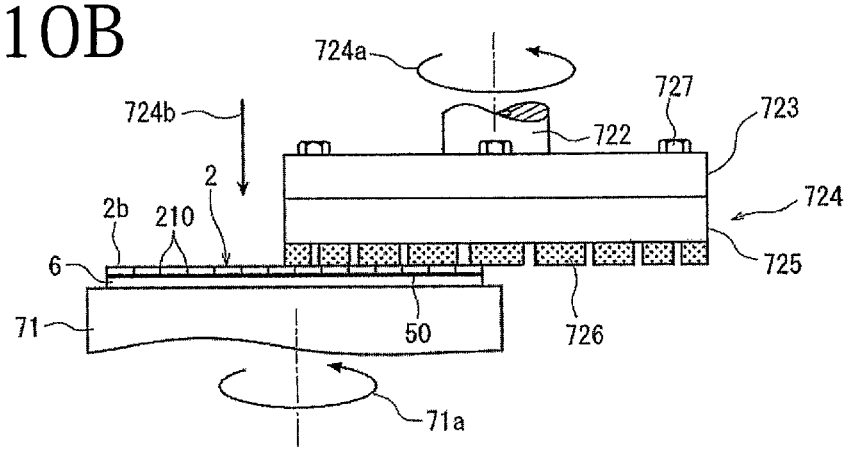

After the aforementioned cut groove forming step is conducted, the water-soluble resin coating step and the protective plate fixing step are performed, after which the back side grinding step is carried out. In the back side grinding step, when the back side 2b of the semiconductor wafer 2 is ground and the thickness of the semiconductor wafer 2 reaches, for example, 100 μm, the cut grooves 210 are exposed to the back side 2b and the semiconductor wafer 2 is divided into individual devices, as illustrated in FIGS. 10A and 10B. Note that in this embodiment, the water-soluble resin coating step is conducted after the cut groove forming step is performed, and, therefore, the water-soluble resin fills the cut grooves 210. Accordingly, when the cut grooves 210 are exposed to the back side 2b of the semiconductor wafer 2, the water-soluble resin filling the cut grooves 210 is exposed.

Now, a third embodiment of the wafer processing method of the present invention will be described below. In the third embodiment, before the water-soluble resin coating step is conducted, a modified layer forming step is carried out in which a laser beam of such a wavelength as to be transmitted through the semiconductor wafer 2 is applied to the semiconductor wafer 2 along the division lines 21, with the focal point of the laser beam positioned inside the semiconductor wafer 2, whereby a modified layer serving as a division start point is formed inside the semiconductor wafer 2 along each of the division lines 21. Then, in the back side grinding step, the semiconductor wafer 2 is divided along the division lines 21 along which the modified layers serving as the division start points have been formed, into the individual devices.

Here, the modified layer forming step will be described referring to FIGS. 11A to 11C. The modified layer forming step is carried out using a laser processing apparatus 10 depicted in FIG. 11A. The laser processing apparatus 10 depicted in FIG. 11A includes a chuck table 11 for holding a workpiece thereon, laser beam application means 12 for applying a laser beam to the workpiece held on the chuck table 11, and imaging means 13 for imaging the workpiece held on the chuck table 11. The chuck table 11, configured to suction hold the workpiece, is moved in a processing feed direction indicated by arrow X in FIG. 11A by processing feeding means (not depicted), and is moved in an indexing feed direction indicated by arrow Y in FIG. 11A by indexing feeding means (not depicted).

The laser beam application means 12 includes a hollow cylindrical casing 121 disposed substantially horizontally. Inside the casing 121 is disposed pulsed laser beam oscillating means (not depicted) that includes a pulsed laser beam oscillator and repetition frequency setting means. To a tip portion of the casing 121 is mounted a focusing device 122 for focusing the pulsed laser beam oscillated from the pulsed laser beam oscillating means. Note that the laser beam application means 12 includes focal point adjusting means (not depicted) for adjusting a focal point position of the pulsed laser beam focused by the focusing device 122.

The imaging means 13 mounted to a tip portion of the casing 121 constituting the laser beam application means 12 includes illumination means for illuminating the workpiece, an optical system for capturing a region illuminated by the illumination means, and an imaging element (CCD) for picking up an image captured by the optical system, and the like, and an image signal thus obtained is sent to control means (not depicted).

Figure 11A:
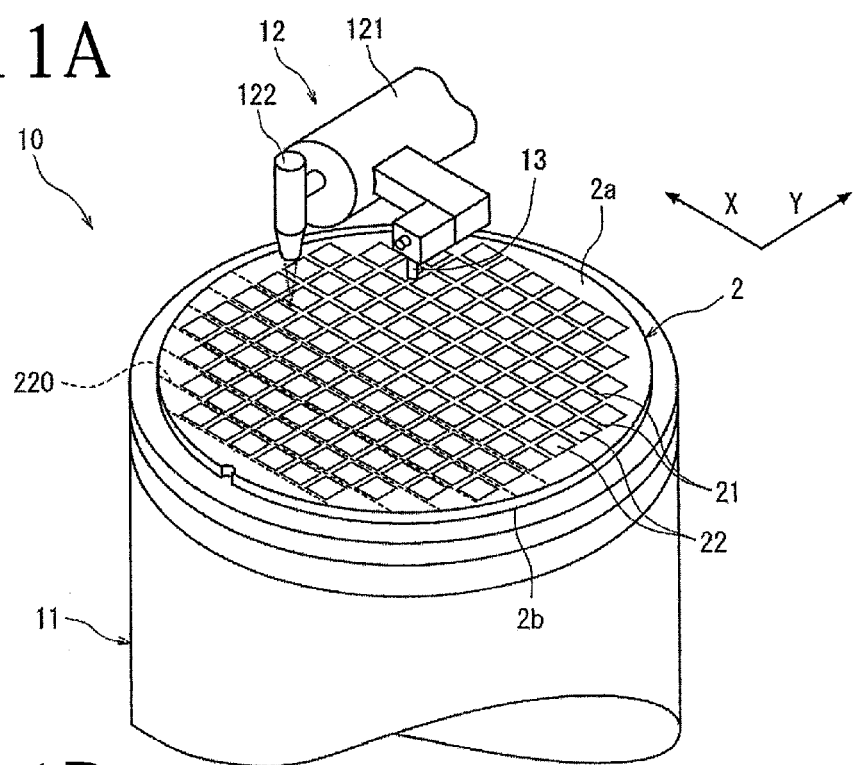
FIGS. 11A to 11C illustrate a modified layer forming step in a third embodiment.

In conducting the modified layer forming step by use of the aforementioned laser processing apparatus 10, first, the semiconductor wafer 2 is placed on the chuck table 11 with its back side 2b on the lower side, as depicted in FIG. 11A. Then, the semiconductor wafer 2 is suction held onto the chuck table 11 by suction means (not depicted). Therefore, the semiconductor wafer 2 held on the chuck table 11 has its front side 2a on the upper side. The chuck table 11 with the semiconductor wafer 2 suction held thereon is positioned directly under the imaging means 13 by processing feeding means (not depicted).

After the chuck table 11 is positioned directly under the imaging means 13, an alignment work for detecting a processing region to be laser processed of the semiconductor wafer 2, by the imaging means 13 and the control means (not depicted), is carried out. Specifically, the imaging means 13 and the control means (not depicted) perform image processing such as pattern matching for matching the position of the division line 21 formed in a predetermined direction of the semiconductor wafer 2 and the position of the focusing device 122 of the laser beam application means 12 for applying the laser beam along the division line 21 to each other, to thereby carry out alignment of the laser beam applying position. In addition, the alignment of the laser beam applying position is conducted also for the division lines 21 formed on the semiconductor wafer 2 to extend in a direction orthogonal to the predetermined direction.

Figure 11B:
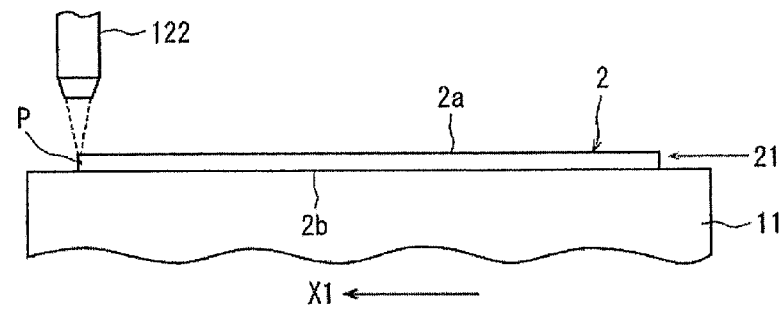
Figure 11C:
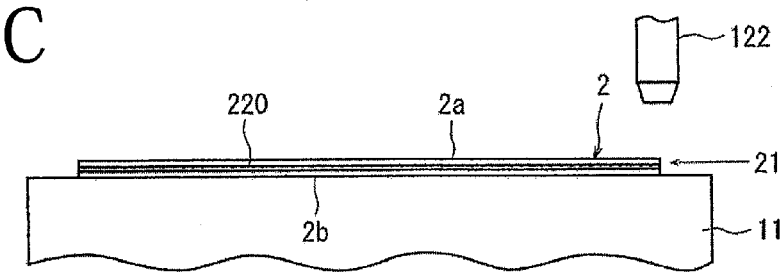

After the division lines 21 formed on the semiconductor wafer 2 held on the chuck table 11 are detected and the alignment of the laser beam applying position is conducted in this way, the chuck table 11 is moved into a laser beam application region where the focusing device 122 of the laser beam application means 12 for applying the laser beam is located as depicted in FIG. 11B, and one end (the left end in FIG. 11B) of a predetermined division line 21 is positioned directly under the focusing device 122 of the laser beam application means 12. Next, the focal point P of the pulsed laser beam applied from the focusing device 122 is positioned at an intermediate portion in the thickness direction of the semiconductor wafer 2. Subsequently, while a pulsed laser beam having such a wavelength (for example, 1,064 nm) as to be transmitted through the silicon wafer is being applied from the focusing device 122, the chuck table 11 is moved at a predetermined feed rate in a direction indicated by arrow X1 in FIG. 11B. Then, when the applying position of the focusing device 122 of the laser beam application means 12 has reached the position of the other end of the division line 21 as depicted in FIG. 11C, the application of the pulsed laser beam is stopped and the movement of the chuck table 11 is stopped. As a result, a modified layer 220 is formed inside the semiconductor wafer 2 along the division line 21 as depicted in FIG. 11C (modified layer forming step). This modified layer forming step is carried out along all the division lines 21 formed on the semiconductor wafer 2.

Figure 12A:
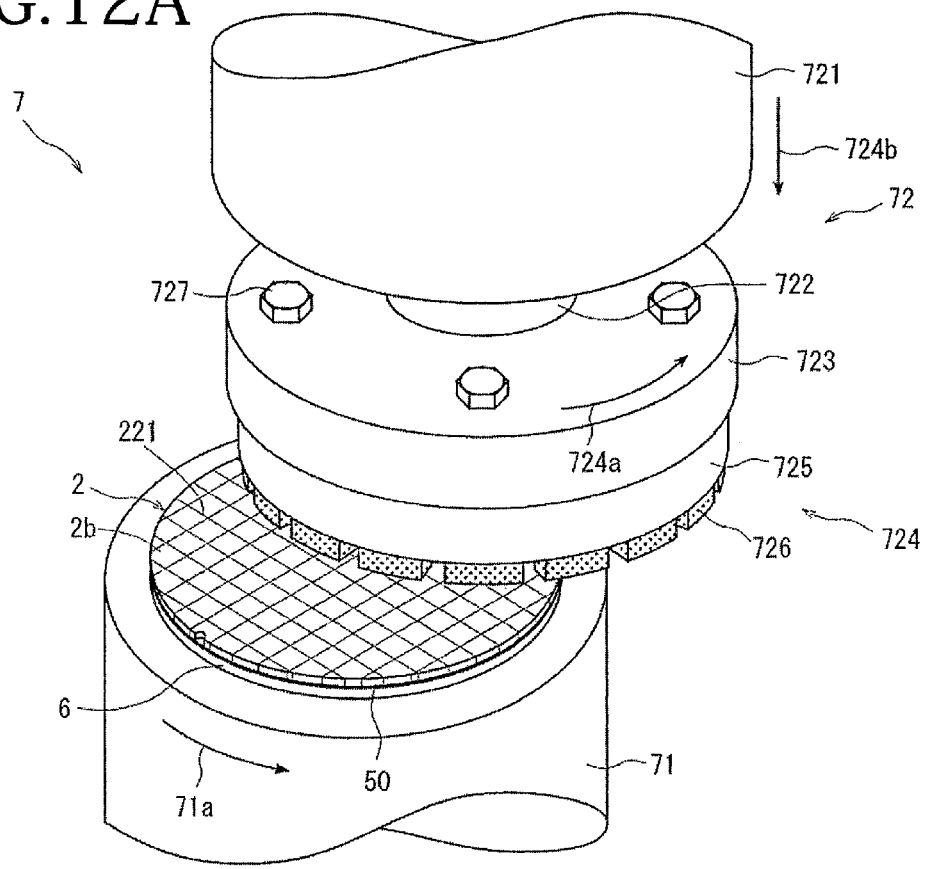
FIGS. 12A and 12B illustrate a back side grinding step in the third embodiment.
Figure 12B:
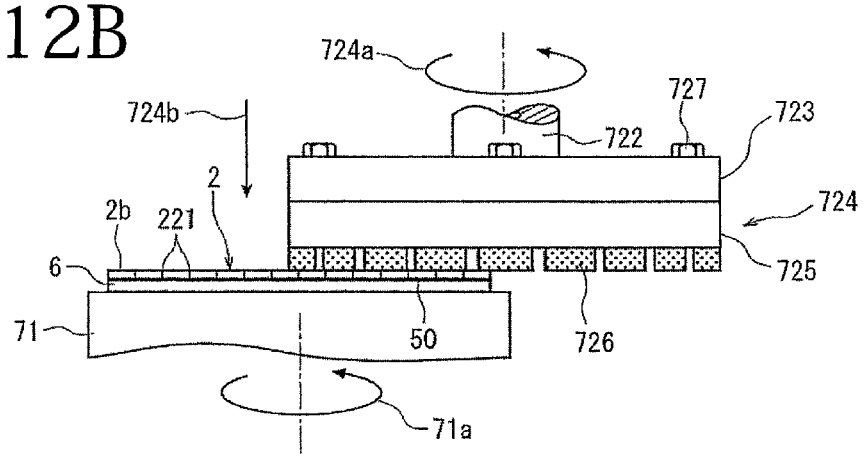

After the aforementioned modified layer forming step is conducted, the water-soluble resin coating step and the protective plate fixing step are performed, after which the back side grinding step is carried out. In the back side grinding step, as depicted in FIGS. 12A and 12B, the back side 2b of the semiconductor wafer 2 is ground to make the semiconductor wafer 2 have a predetermined thickness (for example, 100 μm), and cracks 221 are generated along the division lines 21, where strength has been lowered due to the formation of the modified layers 220, whereby the semiconductor wafer 2 is divided into individual devices. Note that in the aforementioned modified layer forming step, an example has been depicted in which the laser beam is applied from the front side 2a of the semiconductor wafer 2 along the division lines 21 with the focal point of the laser beam being positioned inside the semiconductor wafer 2. In this connection, in the case where the laser beam is applied from the back side 2b of the semiconductor wafer 2 along the division lines 21 with the focal point of the laser beam being positioned inside the semiconductor wafer 2, the modified layer forming step may be carried out after the water-soluble resin coating step and the protective plate fixing step are conducted.

Figure 13A:
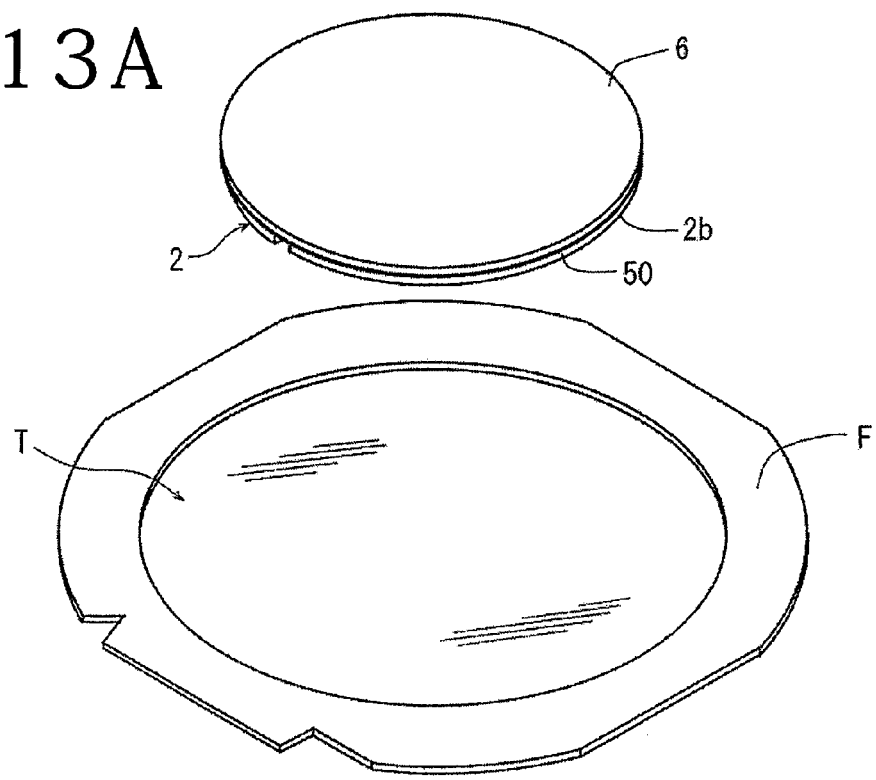
FIGS. 13A and 13B illustrate a protective plate releasing step in the second and third embodiments.
Figure 13B:
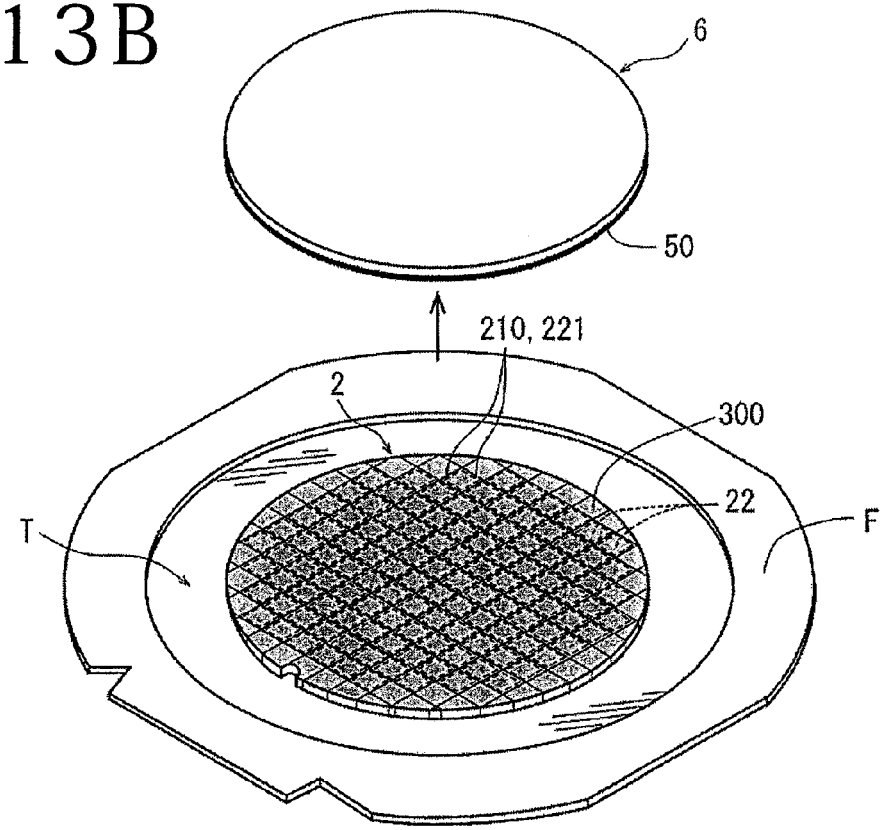

After the back side grinding step in the second and third embodiments is conducted in this manner, a protective plate releasing step is carried out wherein the bond layer 50 formed of the bond material 5 is released from the semiconductor wafer 2 together with the protective plate 6 to which the semiconductor wafer 2 has been fixed, like in the protective plate releasing step illustrated in FIGS. 7A and 7B above. Specifically, as depicted in FIGS. 13A and 13B, the back side 2b of the semiconductor wafer 2 divided into the individual devices 22 is adhered to a surface of a dicing tape T including a synthetic resin sheet of a polyolefin or the like of which an outer peripheral portion is so mounted as to cover an inside opening portion of an annular frame F, and the bond layer 50 is released from the semiconductor wafer 2 together with the protective plate 6 to which the semiconductor wafer 2 has been fixed. Note that in this embodiment, upon the back side grinding step, the semiconductor wafer 2 has been divided into the individual devices 22 due to the exposure of the cut grooves 210 to the back side 2b of the semiconductor wafer 2 or the generation of the cracks 221. Even after the bond layer 50 is released from the semiconductor wafer 2 together with the protective plate 6, part of the bond material 5 may remain on the front side 2a of the semiconductor wafer 2 divided into the individual devices 22.

Figure 14A:
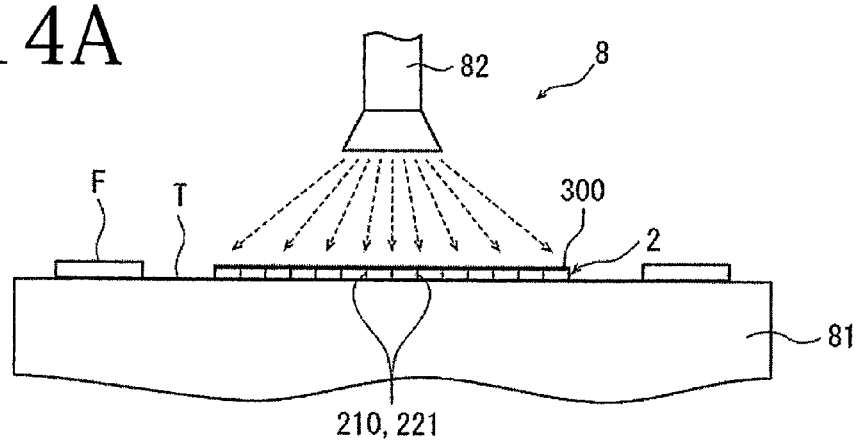
FIGS. 14A to 14C illustrate a bond material removing step in the second and third embodiments.
Figure 14B:
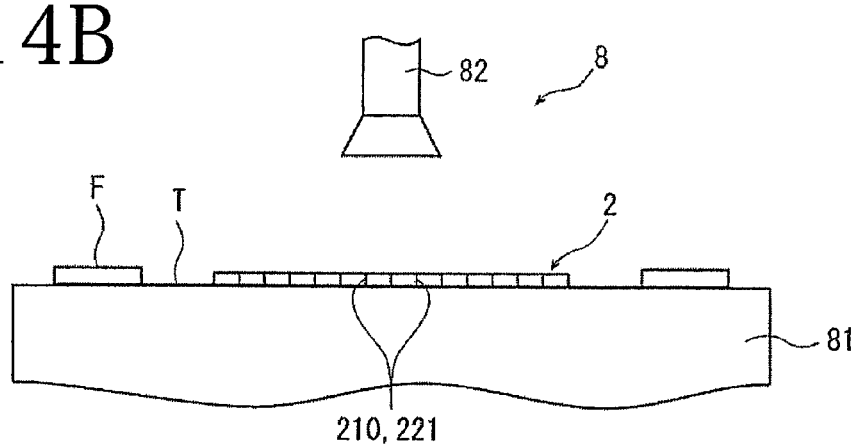
Figure 14C:
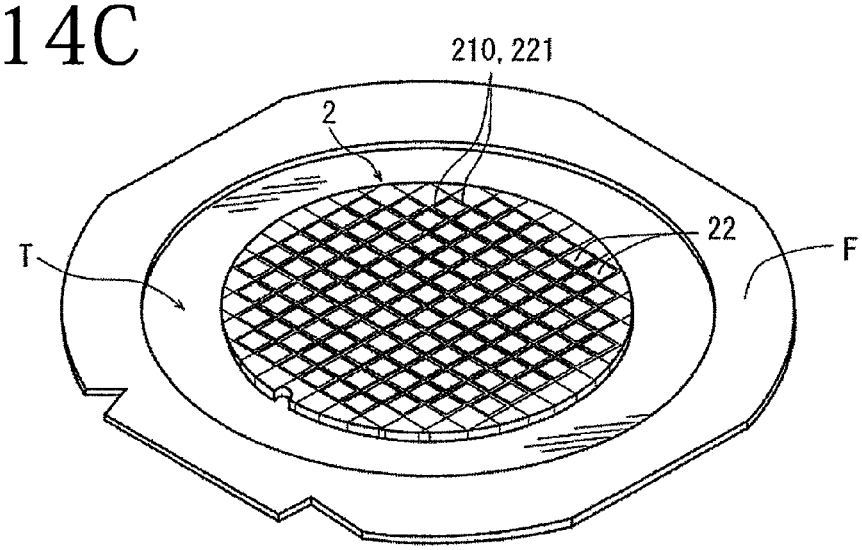

After the aforementioned protective plate releasing step is conducted, a bond material removing step of supplying water to the bond material 5 remaining on the front side 2a of the semiconductor wafer 2 to thereby remove the thin film 300 together with the bond material 5 is carried out, like in the bond material removing step illustrated in FIGS. 8A and 8B above. Specifically, as depicted in FIG. 14A, the semiconductor wafer 2 divided into the individual devices 22 and supported on the annular frame F through the dicing tape T after the protective plate releasing step is conducted is suction held on a holding table 81 of a cleaning device 8 through the dicing tape T therebetween, and cleaning water is supplied from a cleaning water supply nozzle 82 to the bond material 5 remaining on the front side 2a of the semiconductor wafer 2 and to the thin film 300. As a result, as depicted in FIGS. 14B and 14C, the thin film 300 is easily removed by the cleaning water because of being formed of a water-soluble resin, and the bond material 5 remaining on the front side 2a of the semiconductor wafer 2 is also removed. Therefore, a situation in which part of the bond material 5 is left on the front side of the devices 22 is obviated, and, accordingly, the quality of the devices 22 can be prevented from being lowered due to such bond material 5.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer which is formed on a front side thereof with a plurality of division lines in a crossing pattern and in which a plurality of devices are formed in a plurality of regions partitioned by the division lines, the method comprising:
   a water-soluble resin coating step of coating the front side of the wafer with a water-soluble liquid resin to form a thin film;
   a protective plate fixing step of fixing the wafer to a protective plate for protecting the front side of the wafer, with a bond material interposed between the protective plate and the thin film;
   a back side grinding step of holding by a chuck table the protective plate with the wafer fixed thereto and grinding a back side of the wafer to make the wafer have a predetermined thickness;
   a protective plate releasing step of releasing the bond material together with the protective plate to which the wafer has been fixed, after the back side grinding step is conducted; and
   a bond material removing step of supplying water to the bond material remaining on the front side of the wafer having been subjected to the protective plate releasing step, to remove the thin film together with the bond material.

2. The method according to claim 1, further comprising a cut groove forming step of forming cut grooves corresponding to a finished thickness of the devices along the division lines from the side of the front side of the wafer before the water-soluble resin coating step is conducted,
   wherein in the back side grinding step the cut grooves are exposed to the back side of the wafer to thereby divide the wafer into the individual devices.

3. The method according to claim 1, further comprising a modified layer forming step of applying a laser beam having such a wavelength as to be transmitted through the wafer along the division lines, with a focal point of the laser beam being positioned inside the wafer, to form a modified layer serving as a division start point along each of the division lines inside the wafer,
   wherein in the back side grinding step the wafer is divided along the division lines along which the modified layers serving as the division start points have been formed, into the individual devices.

* * * * *